US010355112B2

(12) United States Patent
Chui et al.

(10) Patent No.: US 10,355,112 B2
(45) Date of Patent: *Jul. 16, 2019

(54) FORMING A NON-PLANAR TRANSISTOR HAVING A QUANTUM WELL CHANNEL

(71) Applicant: Intel Corporation, Santa Clara, CA (US)

(72) Inventors: Chi On Chui, San Mateo, CA (US); Prashant Majhi, San Jose, CA (US); Wilman Tsai, Saratoga, CA (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/719,776

(22) Filed: Sep. 29, 2017

(65) Prior Publication Data

US 2018/0033875 A1 Feb. 1, 2018

Related U.S. Application Data

(60) Division of application No. 14/558,947, filed on Dec. 3, 2014, now Pat. No. 9,806,180, which is a continuation of application No. 13/461,962, filed on May 2, 2012, now Pat. No. 8,921,830, which is a division of application No. 13/046,061, filed on Mar. 11, 2011, now Pat. No. 8,237,153, which is a continuation of application No. 11/728,891, filed on Mar. 27, 2007, now Pat. No. 7,928,426.

(51) Int. Cl.
| | |
|---|---|
| *H01L 29/66* | (2006.01) |
| *H01L 29/10* | (2006.01) |
| *H01L 29/78* | (2006.01) |
| *H01L 29/165* | (2006.01) |
| *H01L 29/778* | (2006.01) |

(52) U.S. Cl.
CPC .... *H01L 29/66977* (2013.01); *H01L 29/1054* (2013.01); *H01L 29/165* (2013.01); *H01L 29/66431* (2013.01); *H01L 29/66795* (2013.01); *H01L 29/785* (2013.01); *H01L 29/7842* (2013.01); *H01L 29/778* (2013.01)

(58) Field of Classification Search
CPC ....... H01L 2924/00; H01L 2224/32225; H01L 2224/48227; H01L 2224/73265; H01L 2224/73204
See application file for complete search history.

(56) References Cited

U.S. PATENT DOCUMENTS

| | | | |
|---|---|---|---|
| 5,406,094 | A | 4/1995 | Arimoto et al. |
| 6,472,685 | B2 | 10/2002 | Takagi |
| 6,849,487 | B2 | 2/2005 | Taylor, Jr. et al. |
| 7,105,851 | B2 | 9/2006 | Dubin |
| 7,161,206 | B2 | 1/2007 | Oh et al. |

(Continued)

OTHER PUBLICATIONS

U.S. Appl. No. 11/529,963, filed Sep. 29, 2006, entitled, "Methods for Uniform Doping of Non-Planar Transistor Structures," by Brian Doyle, et al.

(Continued)

*Primary Examiner* — Tony Tran
(74) *Attorney, Agent, or Firm* — Trop, Pruner & Hu, P.C.

(57) ABSTRACT

In one embodiment, the present invention includes an apparatus having a substrate, a buried oxide layer formed on the substrate, a silicon on insulator (SOI) core formed on the buried oxide layer, a compressive strained quantum well (QW) layer wrapped around the SOI core, and a tensile strained silicon layer wrapped around the QW layer. Other embodiments are described and claimed.

15 Claims, 3 Drawing Sheets

(56) References Cited

U.S. PATENT DOCUMENTS

| | | |
|---|---|---|
| 2003/0127646 A1 | 7/2003 | Christansen et al. |
| 2004/0157353 A1 | 8/2004 | Ouyang |
| 2006/0148182 A1 | 7/2006 | Datta et al. .................. 438/289 |
| 2006/0237770 A1 | 10/2006 | Huang et al. |
| 2006/0237801 A1 | 10/2006 | Kavalieros et al. .......... 257/388 |
| 2006/0292765 A1 | 12/2006 | Blanchard |
| 2008/0050883 A1 | 2/2008 | Enicks |
| 2008/0164539 A1 | 7/2008 | Collaert |
| 2009/0280626 A1 | 11/2009 | Zhu |

OTHER PUBLICATIONS

U.S. Appl. No. 11/450,745, filed Jun. 9, 2006, entitled, "Strain-Inducing Semiconductor Regions," by Suman Datta, et al.

Jack Kavaileros, et al., "Tri-Gate Transistor Architecture with High-k Gate Dielectrics, Metal Gates and Strain Engineering," Jun. 2006, pp. 1-2.

Yu-Hsuan Kuo, et al., "Strong Quantum-Confined Stark Effect in Germanium Quantum-Well Structures on Silicon," Oct. 2005, pp. 1334-1336.

Minjoo L. Lee, et al., "Srained Si, SiGe, and Ge Channels for High-Mobility Metal-Oxide-Semiconductor Field-Effect Transistors," Dec. 2004, pp. 1-27.

Minjoo L. Lee, et al., "Strained Si/strained Ge Dual-Channel Heterostructures on Relaxed $Si_{0.8}Ge_{0.5}$ for Symmetric Mobility p-Type and n-Type Metal-Oxide-Semiconductor Field-Effect Transistors," Sep. 2003, pp. 4202-4204.

Chinese Patent Office, First Office Action dated Jul. 14, 2010 in Chinese patent application No. 200880006179.4.

Korean Patent Office, International Search Report and Written Opinion for International Application No. PCT/US2008/057951, 8 Pgs., dated Jul. 14, 2008.

FORMING A NON-PLANAR TRANSISTOR HAVING A QUANTUM WELL CHANNEL

This application is a divisional of U.S. patent application Ser. No. 14/558,947, filed Dec. 3, 2014, which is a continuation of Ser. No. 13/461,962, filed May 2, 2012, now U.S. Pat. No. 8,921,830, issued Dec. 30, 2014, which is a divisional of U.S. patent application Ser. No. 13/046,061, filed Mar. 11, 2011, now U.S. Pat. No. 8,237,153, issued on Aug. 7, 2012, which is a continuation of U.S. patent application Ser. No. 11/728,891, filed Mar. 27, 2007, now U.S. Pat. No. 7,928,426, issued on Apr. 19, 2011, the content of which is hereby incorporated by reference.

BACKGROUND

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as complementary metal oxide semiconductor (CMOS) and quantum well (QW) transistors fabricated from extreme high mobility materials such as, but not limited to, indium antimonide (InSb), indium gallium arsenide (InGaAs) and indium arsenide (InAs). While such high mobility QW channels have been incorporated into planar transistors, they have not been incorporated into non-planar transistors.

DETAILED DESCRIPTION

In various embodiments, a high-mobility strained quantum well (QW) channel may be incorporated into a non-planar structure such as a non-planar metal oxide semiconductor field effect transistor (MOSFET). Such non-planar transistors include a silicon structure or fin formed on an underlying-oxide layer, and in turn a gate structure can be formed around the silicon fin. In this way, high mobility channels with excellent electrostatic control can be achieved for ultimate channel length scalability. Furthermore, tensile and compressive strain may be simultaneously introduced to respectively optimize electron transport in silicon for n-channel MOSFETs (NMOS) and hole transport in germanium (Ge) for p-channel MOSFETs (PMOS) using a common material core. Furthermore, correct and sufficient conduction and valence band offsets provide for electron and hole confinement. Using embodiments, transistor devices may be formed using conventional stack engineering, as an outermost core layer may be formed of silicon to allow formation of a gate stack thereon.

Figure 1:
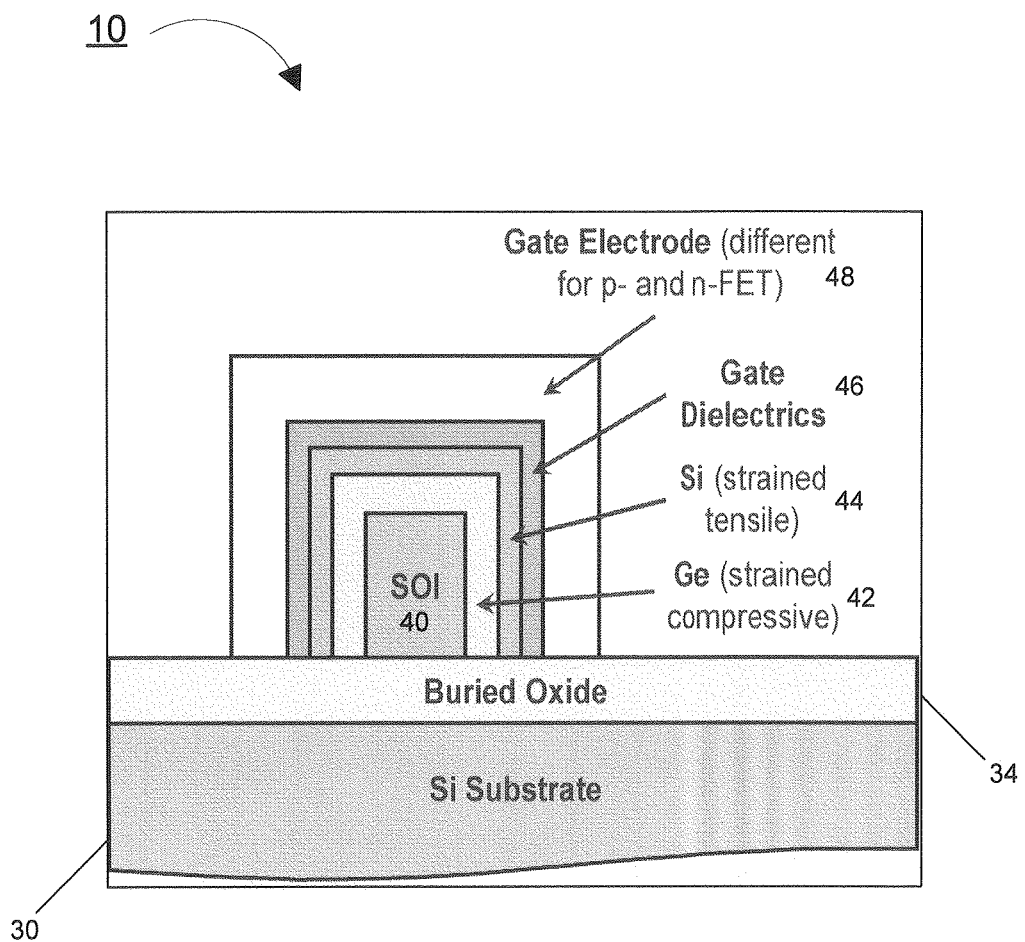
FIG. 1 is a cross section view of a device structure in accordance with an embodiment of the present invention.

Referring now to FIG. 1, shown is a cross section view of a device structure 10 in accordance with an embodiment of the present invention. As shown in FIG. 1, structure 10 may be used to form NMOS or PMOS devices on a substrate 30. In various embodiments, substrate 30 may be a high resistivity n or p-type (100) off-oriented Si substrate, although the scope of the present invention is not limited in this regard. As shown in FIG. 1, next a buried oxide layer 34 may be formed on substrate 30. In various embodiments, buried oxide layer 34 may be formed of a suitable oxide material such as silicon dioxide ($SiO_2$) or other oxide.

Still referring to FIG. 1, next a silicon on insulator (SOI) layer may be formed. Specifically, a SOI layer may be deposited (or bonded) and patterned to obtain a SOI core 40, which is a non-planar structure on buried oxide layer 34. Note this SOI core is formed of a silicon fin or narrow strip that has a width much less than the extent of buried oxide layer 34. Note, this layer may also be strained. As shown in FIG. 1, a compressive strained QW layer 42 may be wrapped around SOI core 40. In various embodiments, QW layer 42 may be a Ge layer selectively grown on SOI core 40. The growth may be conducted by vapor deposition method and thickness can range from 1 nanometers (nm)-20 nm. Next, a tensile strained Si layer 44 may be formed on QW layer 42. In various embodiments, Si layer 44 may be selectively grown to wrap around QW layer 42. The growth may be conducted by vapor deposition method and thickness can range from 1 nm-20 nm. Using this configuration, holes (electrons) may travel and be confined within QW layer 42 for high mobility conduction.

Referring still to FIG. 1, next a gate dielectric layer 46 may be formed over Si layer 44. In various embodiments, a conformal gate dielectric layer may be formed using an atomic layer deposition (ALD) to thus wrap around the core formed of Si/Ge/SOI. In various embodiments, gate dielectric layer 46 may be formed using a low dielectric constant (low-k) material such as a carbon doped oxide or other such dielectric. Over gate dielectric layer 46, a gate electrode layer 48 may be formed. In various embodiments, an ALD process may be used to form conformal gate electrode layer 48. Note that in various embodiments, similar or different electrode materials may be used for n-channel and p-channel MOSFETs.

While shown with this particular implementation in the embodiment of FIG. 1, the scope of the present invention is not limited in this regard. For example, in other embodiments a bulk Si substrate may be used with appropriate isolation to form the Si core (i.e., over a given SOI substrate). Furthermore, instead of a QW layer formed of pure Ge, a QW layer may be formed using high Ge content silicon germanium (SiGe) with compressive strain. In various embodiments, the Ge concentration may be between approximately 10% and 100%. In this way, thicker QWs may be realized for particular applications. While not shown in FIG. 1, a fully completed device may further include source and drain electrodes formed of a contact layer. For an NMOS device, the contact layer may be n+doped, while for a PMOS device, the contact layer may be p+doped.

Accordingly, in various embodiments non-planar transistor devices may be formed using a high mobility material to form high electron mobility transistors (HEMTs) or high hole mobility transistors (HHMTs) or high hole mobility transistors (HHMTs) having high speed and low power consumption. Such devices may have dimensions less than approximately 50 nm with a switching frequency of approximately 562 gigahertz (GHz). Such devices may be able to operate at between approximately 0.5-1.0 volts without significant reduction of drive current. Furthermore, embodiments may provide lower gate delay at a gate length than a silicon based device.

Figure 2:
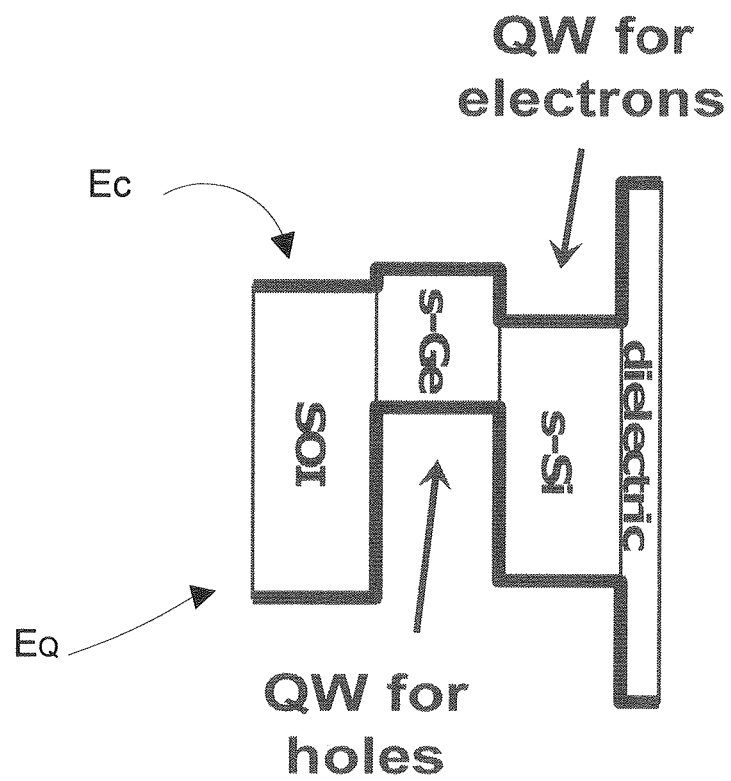
FIG. 2 is a band diagram of a structure in accordance with an embodiment of the present invention.

Referring now to FIG. 2, shown is a band diagram of a structure in accordance with an embodiment of the present invention. As shown in FIG. 2, the band diagram illustrates, via the top line a conduction band (i.e., $E_C$) and via the lower line a valence band (i.e., $E_V$). Beginning at the left-hand side of FIG. 2, the SOI layer, which may be pure silicon, is formed. Over this layer, a QW layer, which may be formed of compressive strain germanium or silicon germanium (SiGe) may be formed. The QW channel layer may be formed having a smaller bandgap than the SOI core. Over the QW channel layer, an upper tensile strained silicon layer may be formed that may, in some embodiments have a smaller bandgap than the SOI core, but a layer bandgap than the QW channel layer. Then, as shown in FIG. 2, a dielectric layer may be formed over the silicon layer which has a larger bandgap than the other layers. As shown in FIG. 2, the Ge layer provides a QW for holes and the Si layer provides the QW for electrons.

Figure 3:
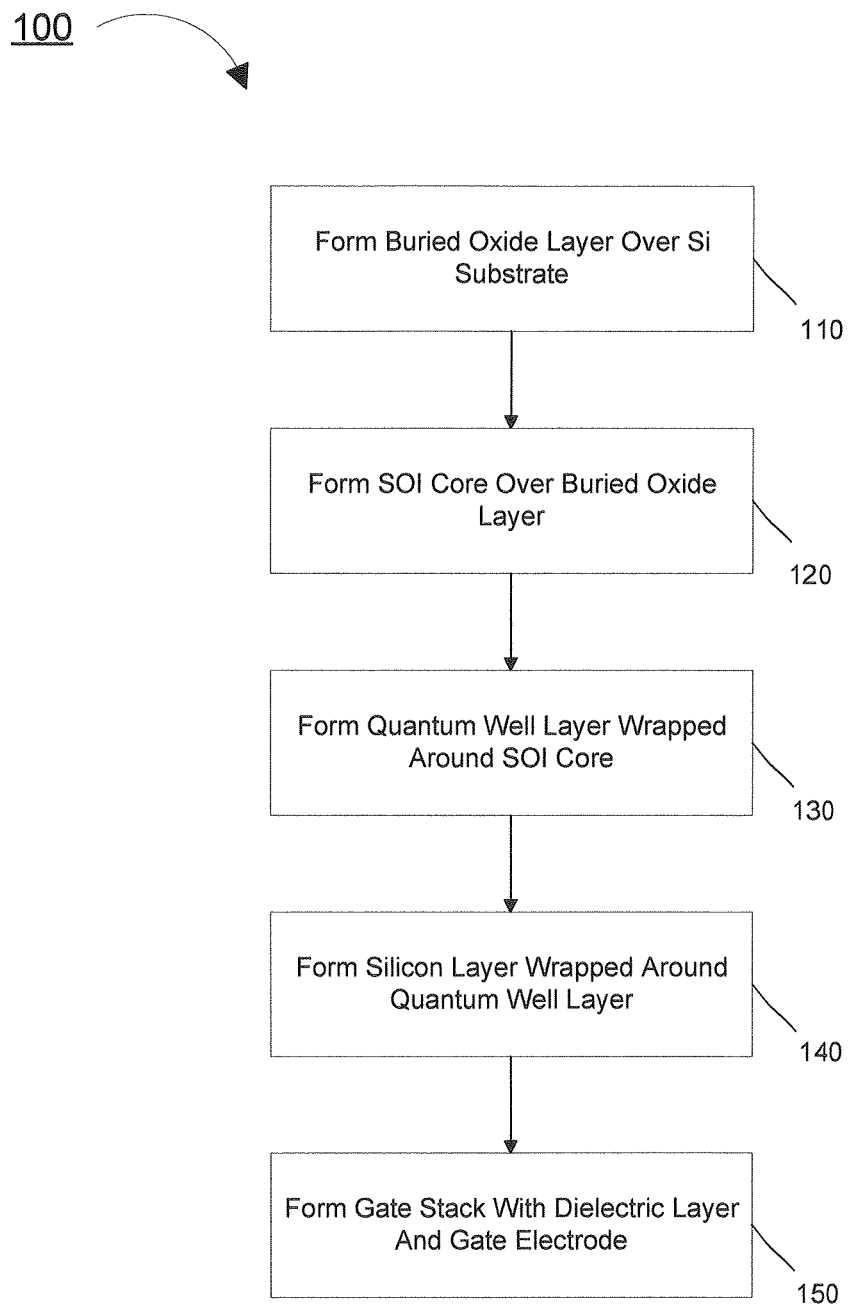
FIG. 3 is a flow diagram of a method in accordance with an embodiment of the present invention.

Referring now to FIG. 3, shown is a flow diagram of a method in accordance with an embodiment of the present invention. As shown in FIG. 3, method 100 may begin by forming a buried oxide layer over a Si substrate (block 110). Next, a SOI core may be formed over the buried oxide layer (block 120). For example, a silicon layer may be deposited (or bonded) and patterned to form the SOI core. Then a QW layer may be wrapped around the SOI core (block 130). For example, in one embodiment a strained compressive Ge or SiGe layer may be grown on the SOI core. Above the QW layer, an Si layer may be formed to wrap around the QW layer (block 140). Then a gate stack may be formed over the structure, including a dielectric layer and a gate electrode (block 150). In various embodiments, ALD processes may be performed to obtain a conformal gate dielectric layer and a conformal gate electrode. In this way, a non-planar transistor having high mobility may be formed.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a buried oxide layer directly on a substrate;
   forming a semiconductor fin comprising a silicon on insulator core directly on the buried oxide layer, the semiconductor fin providing a channel region for a non-planar field effect transistor (FET);
   forming a first semiconductor layer comprising silicon germanium (SiGe) directly on and wrapped around the semiconductor fin and directly contacting at least a portion of the buried oxide layer, wherein the first semiconductor layer comprises a quantum well layer including a smaller bandgap than a bandgap of the semiconductor fin, the SiGe having a Ge concentration of at least approximately 10%;
   forming a second semiconductor layer comprising tensile strained silicon directly on and wrapped around the first semiconductor layer;
   forming a dielectric layer adjacent the second semiconductor layer; and
   forming a gate electrode adjacent the dielectric layer, the gate electrode and the dielectric layer directly contacting at least a portion of the buried oxide layer.

2. The method of claim 1, further comprising providing a quantum well for holes via the first semiconductor layer.

3. The method of claim 2, further comprising providing a quantum well for electrons via the second semiconductor layer.

4. The method of claim 1, further comprising forming the first semiconductor layer comprising a compressive strained quantum well layer.

5. The method of claim 1, further comprising forming the silicon on insulator core of pure silicon.

6. The method of claim 1, further comprising forming the second semiconductor layer including a smaller bandgap than the bandgap of the semiconductor fin and a larger bandgap than the bandgap of the first semiconductor layer.

7. The method of claim 1, further comprising forming the first semiconductor layer by growing the first semiconductor layer.

8. A method comprising:
   forming a buried oxide layer directly on a substrate;
   depositing a silicon layer directly over the buried oxide layer;
   patterning the silicon layer to form a semiconductor fin comprising a silicon on insulator core directly on the buried oxide layer, the semiconductor fin providing a channel region for a non-planar transistor;
   forming a first semiconductor layer comprising silicon germanium (SiGe) directly on and wrapped around the semiconductor fin and directly contacting at least a portion of the buried oxide layer, wherein the first semiconductor layer comprises a compressive strained quantum well layer including a smaller bandgap than a bandgap of the semiconductor fin;
   forming a second semiconductor layer comprising tensile strained silicon directly around the first semiconductor layer; and
   forming a gate stack over the second semiconductor layer and directly contacting at least a portion of the buried oxide layer, the gate stack including a dielectric layer and a gate electrode.

9. The method of claim 8, further comprising forming the first semiconductor layer having a Ge concentration of at least approximately 10%.

10. The method of claim 8, further comprising providing a quantum well for holes via the first semiconductor layer.

11. The method of claim 10, further comprising providing a quantum well for electrons via the second semiconductor layer.

12. A method comprising:
   forming a buried oxide layer directly on a substrate;
   forming a semiconductor fin comprising a silicon on insulator core directly on the buried oxide layer such that at least a portion of the buried oxide layer is interposed between the semiconductor fin and the substrate, the semiconductor fin providing a channel region for a non-planar transistor;
   forming a first semiconductor layer comprising silicon germanium (SiGe) directly on and wrapped around the semiconductor fin and directly contacting at least a portion of the buried oxide layer, wherein the first semiconductor layer comprises a quantum well layer including a smaller bandgap than a bandgap of the semiconductor fin;
   forming a second semiconductor layer comprising tensile strained silicon directly around the first semiconductor layer;
   forming a dielectric layer adjacent the second semiconductor layer; and
   forming a gate electrode adjacent the dielectric layer, the gate electrode and the dielectric layer directly contacting at least a portion of the buried oxide layer.

13. The method of claim 12, further comprising forming the first semiconductor layer having a Ge concentration of at least approximately 10%.

14. The method of claim 12, further comprising providing a quantum well for holes via the first semiconductor layer.

15. The method of claim 14, further comprising providing a quantum well for electrons via the second semiconductor layer.

* * * * *